(12) United States Patent
Oita

(10) Patent No.: US 6,791,421 B2
(45) Date of Patent: Sep. 14, 2004

(54) INPUT-SWITCHING VOLTAGE-CONTROLLED OSCILLATOR AND PLL-CONTROLLED OSCILLATOR

(75) Inventor: Takeo Oita, Saitama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 0 days.

(21) Appl. No.: 10/279,146

(22) Filed: Oct. 23, 2002

(65) Prior Publication Data
US 2003/0076184 A1 Apr. 24, 2003

(30) Foreign Application Priority Data
Oct. 24, 2001 (JP) ........................................ 2001-326776

(51) Int. Cl.[7] ................................................ H03L 7/14
(52) U.S. Cl. ........................ 331/14; 331/17; 331/36 C; 331/158
(58) Field of Search ................................ 331/8, 14, 17, 331/18, 25, 36 C, 116 R, 116 FE, 117 R, 117 FE, 117 D, 158, 177 R, 177 V, 179

(56) References Cited

U.S. PATENT DOCUMENTS

| | | | | |
|---|---|---|---|---|
| 4,746,879 A | * | 5/1988 | Ma et al. | 331/44 |
| 5,410,572 A | * | 4/1995 | Yoshida | 375/376 |
| 5,668,506 A | * | 9/1997 | Watanabe et al. | 331/66 |
| 5,892,408 A | * | 4/1999 | Binder | 331/44 |
| 6,342,818 B1 | * | 1/2002 | Segawa et al. | 331/14 |

* cited by examiner

Primary Examiner—David Mis
(74) Attorney, Agent, or Firm—Knobbe Martens Olson & Bear, LLP

(57) ABSTRACT

A PLL-controlled oscillator that can be suitably used for such purposes as a jitter filter in an optical transmission system includes an input voltage-switching control oscillator as a voltage-controlled oscillator (VCO). The input voltage-switching control oscillator includes: an oscillation closed loop that is provided with a variable-voltage capacitance element; and a switch for interchangeably selecting one of a plurality of voltages in accordance with a selection signal and applying the selected voltage as a control voltage to the variable-voltage capacitance element.

16 Claims, 3 Drawing Sheets

INPUT-SWITCHING VOLTAGE-CONTROLLED OSCILLATOR AND PLL-CONTROLLED OSCILLATOR

BACKGROUND OF THE INVENTION

1. Field of the Invention

The present invention relates to an input-switching voltage-controlled oscillator and to a PLL-controlled oscillator that uses the input-switching voltage-controlled oscillator, and more particularly to voltage-controlled oscillator that is applied in a PLL-controlled oscillator that is used as a jitter filter incorporated in an optical transponder of an optical transmission system.

2. Description of the Related Arts

A jitter filter is used in an optical transmission system for shaping and recovering jitter, i.e., fluctuation over time in the waveform of an electrical synchronizing signal or electrical clock signal. A jitter filter normally employs a voltage-controlled oscillator implemented by means of a PLL (phase-locked loop) control, i.e., a PLL-controlled oscillator.

FIG. 1 shows the construction of a PLL-controlled oscillator of the prior art that is used as a jitter filter. This PLL-controlled oscillator is generally constituted by phase detector (PD) 1, low-pass filter (LPF) 2, and voltage-controlled oscillator (VCO) 3. Phase detector 1 compares the phases of reference signal $f_r$ and feedback frequency signal $f_o$, which is one portion of the output of voltage-controlled oscillator 3, and generates a voltage corresponding to the phase difference of the two signals. This phase difference voltage is supplied to low-pass filter 2. In general cases, the phase difference voltage from phase detector 1 is amplified by an amplifier (not shown in the figure) and then applied to low-pass filter 2. Low-pass filter 2 eliminates the high-frequency components from the phase difference voltage and smoothes the voltage to generate control voltage $V_{cp}$.

Since the range of variation in the oscillation frequency need not be particularly great for a PLL-controlled oscillator that is used in a jitter filter, a voltage-controlled crystal oscillator (VCXO) is preferably used as voltage-controlled oscillator 3.

FIG. 2 shows an example of the construction of this type of voltage-controlled oscillator 3. Voltage-controlled oscillator 3 is provided with, for example, quartz-crystal unit 4, oscillation circuit (OSC) 5 that with crystal unit 4 constitutes an oscillation closed loop, and variable-voltage capacitance element 6 such as a variable capacitance diode that is inserted in the oscillation closed-loop. Control voltage $V_{cp}$ is applied by way of high-frequency blocking resistor 7 to the cathode of variable-voltage capacitance element 6. Oscillation circuit 5 is provided with an oscillation capacitor that is connected to crystal unit 4, and an oscillation amplifier. When the capacitance between the terminals of variable-voltage capacitance element 6 changes due to the application of control voltage $V_{cp}$ to variable-voltage capacitance element 6, the serial equivalent capacitance of the oscillation closed loop as seen from crystal unit 4 changes, and oscillation frequency $f_o$ changes.

In this type of PLL-controlled oscillator, the phases of feedback frequency signal $f_o$, which is a portion of the output of voltage-controlled oscillator 3, and reference signal $f_r$ are compared, control voltage $V_{cp}$ that accords with the phase difference is supplied to voltage-controlled oscillator 3, and output frequency $f_o$ therefore imitates the frequency of reference signal $f_r$. Accordingly, the stability of output frequency $f_o$ of PLL-controlled oscillator, i.e., the output frequency of voltage-controlled oscillator 3, depends on the frequency stability of reference signal $f_r$, the stability of output frequency $f_o$ rising if the output stability of reference signal $f_r$ rises.

In an optical transmission system, however, a clock signal is typically transmitted to serve as the reference for the insertion or extraction of information signals. Fluctuations in time are produced in this clock signal during transmission through an optical cable of long or intermediate distance, and the jitter characteristic therefore worsens. The above-described PLL-controlled oscillator is used to restore the jitter characteristic that has deteriorated in this way. In such a case, the clock signal that has been received by way of the optical cable is supplied to the PLL-controlled oscillator as reference signal $f_r$. Jitter, i.e., the fluctuation in time in the waveform, is absorbed by low-pass filter 2, and a clock signal in which the jitter characteristic has been restored can therefore be obtained from voltage-controlled oscillator 3. The jitter characteristic of the clock signal that is outputted from voltage-controlled oscillator 3 is dependent on the jitter characteristic of voltage-controlled oscillator 3 itself. Even in such cases, the frequency stability of the clock signal that is outputted from voltage-controlled oscillator 3 is dependent on the frequency stability of the clock signal that is used as reference signal $f_r$. Thus, if a crystal oscillator having an excellent jitter characteristic is applied in voltage-controlled oscillator 3, the jitter characteristic of the clock signal that is transmitted through the optical cable can be restored while maintaining the frequency stability.

Thus, in a PLL-controlled oscillator of the above-described construction, extinction of the clock signal on the transmission path for whatever reason and resultant failure to receive reference signal $f_r$ as input results in the occurrence of abnormalities in output frequency and the inability to obtain the output itself. Thus, in the prior art, detection was performed to determine whether or not reference signal $f_r$ was being supplied to the PLL-controlled oscillator that was employed as a jitter filter, and upon detecting that reference signal $f_r$ was not being supplied, switching was performed to a synchronizing signal generator such as a crystal oscillator provided separately from the PLL-controlled oscillator and the output of this synchronizing signal generator was employed. However, this necessity to provide a synchronizing signal generator such as a crystal oscillator separate from the PLL-controlled oscillator in such a configuration of the prior art both increased costs and impeded the miniaturization of the jitter filter.

Although output from the synchronizing signal generator could be used at all times regardless of whether the clock signal is received as input or not, thereby obviating the need for a PLL-controlled oscillator to begin with, such a solution lacks compatibility with existing optical transmission systems. Essentially, in an optical transmission system, a clock signal used in a device on the receiving side is typically generated based on the clock signal that is transmitted from a device on the transmitting side, and the use of an independent synchronizing signal generator in the receiving-side device raises the danger of divergence between the clock signals of the transmitting and receiving sides. Thus, in actuality, not only is a PLL-controlled oscillator required, but a synchronizing signal generator is also provided in reserve for such cases as the interruption of the clock signal from the transmitting side.

SUMMARY OF THE INVENTION

It is a first object of the present invention to provide an input-switching voltage-controlled oscillator for use in a PLL-controlled oscillator, this voltage-controlled oscillator both being compact and economical and maintaining stable oscillation output in cases such as the interruption of a reference signal.

It is a second object of the present invention to provide a PLL-controlled oscillator for use as, for example, a jitter filter, this PLL-controlled oscillator both being compact and economical and maintaining oscillation output in cases such as the interruption of a reference signal.

The first object of the present invention is achieved by an input-switching voltage-controlled oscillator that includes: an oscillation closed-loop provided with a variable-voltage capacitance element; and a switch for interchangeably selecting one of a plurality of voltages in accordance with a selection signal and applying this voltage as a control voltage to the variable-voltage capacitance element.

The first object of the present invention is also achieved by an input-switching voltage-controlled oscillator that includes: a variable-voltage capacitance element to which a control signal is applied; a capacitor; and a switch for interchangeably selecting one of the variable-voltage capacitance element and the capacitor according to a selection signal and inserting the selected component into an oscillation closed loop.

The second object of the present invention is achieved by a PLL-controlled oscillator that includes: a phase comparator for detecting the phase difference between a reference signal and an output signal; a low-pass filter connected to an output of the phase comparator for outputting a control voltage; an oscillation means for generating the output signal; a selection means for, in accordance with a selection signal, making a transition between a first state in which the oscillation means is caused to oscillate at an output frequency that changes in accordance with said control voltage and a second state in which said oscillation means is caused to oscillate at an output frequency that is unaffected by said PLL-control signal.

DETAILED DESCRIPTION OF THE INVENTION

Figure 1:
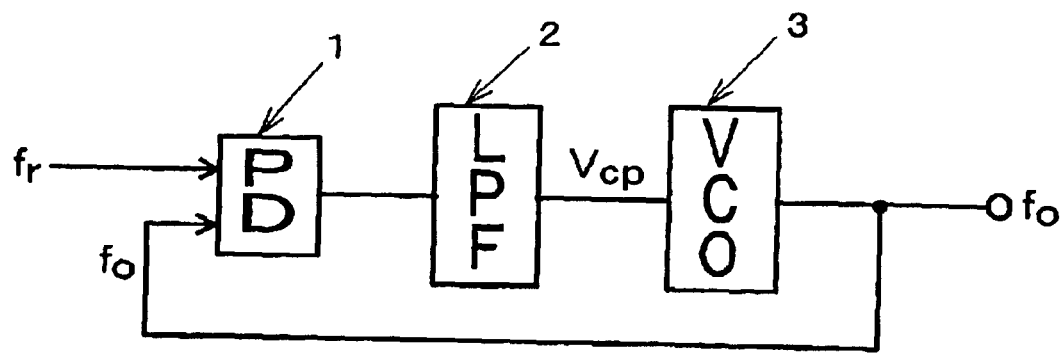
FIG. 1 is a block diagram showing an example of a PLL-controlled oscillator of the prior art.
Figure 2:
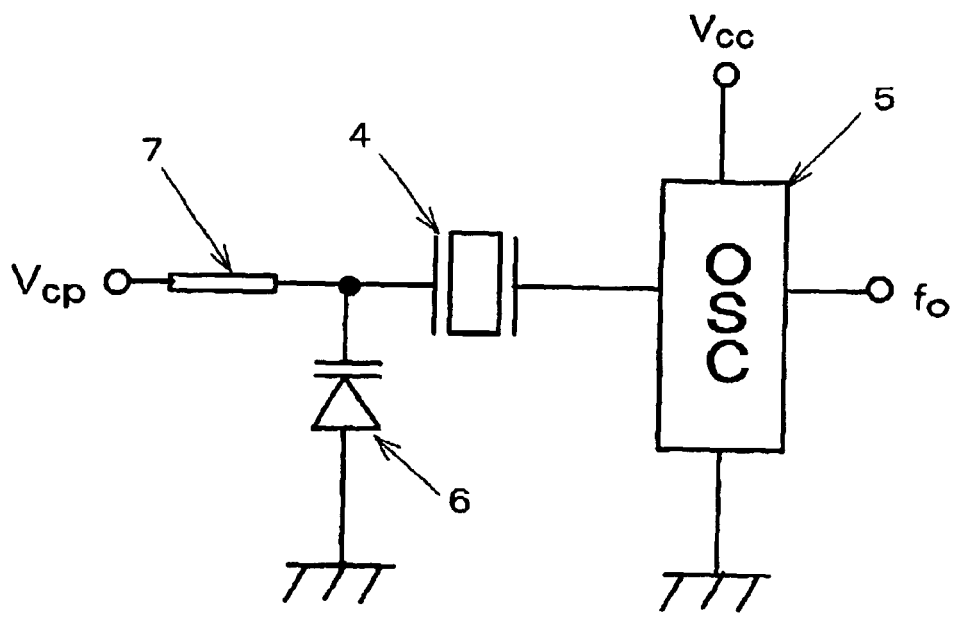
FIG. 2 is a block diagram showing an example of a voltage-controlled oscillator that is used in the PLL-controlled oscillator shown in FIG. 1.
Figure 3:
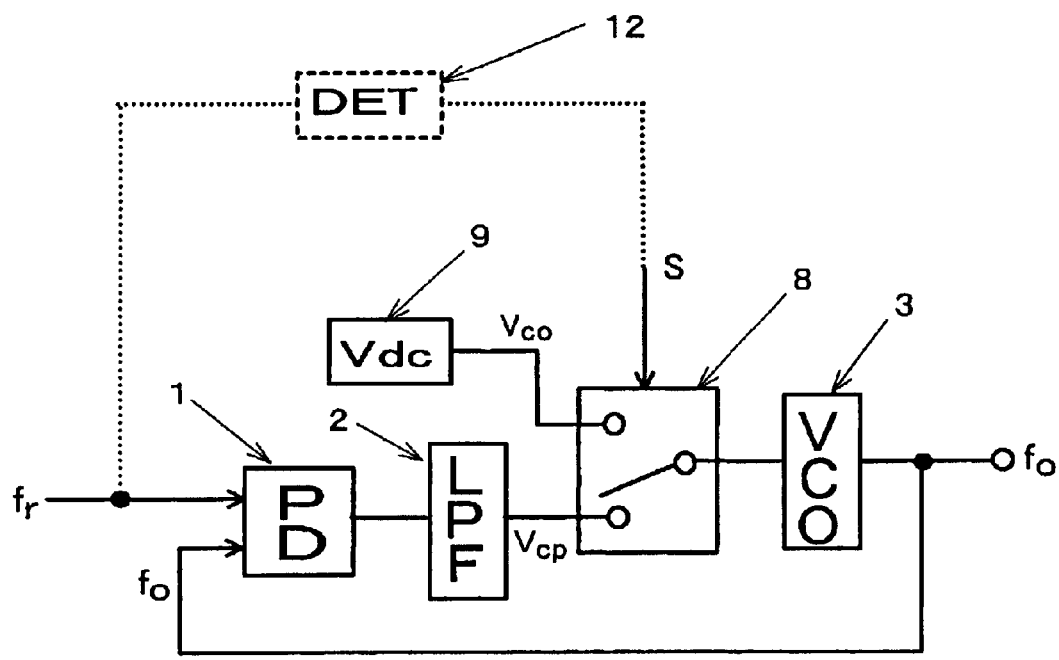
FIG. 3 is a block diagram showing a PLL-controlled oscillator according to a first embodiment of the present invention.

FIG. 3 shows the configuration of a PLL-controlled oscillator of the first embodiment of the present invention. This PLL-controlled oscillator uses an input-switching voltage-controlled oscillator based on the present invention and is preferably used as a jitter filter. In general, the PLL-controlled oscillator is composed of: phase detector (PD) 1, low-pass filter (LPF) 2, voltage-controlled oscillator (VCO) 3, switch 8, and dc voltage supply (Vdc) 9. Phase detector 1 compares the phases of reference signal $f_r$ and feedback frequency signal $f_o$, which is a portion of and branched from the output of voltage-controlled oscillator 3, and generates a voltage that corresponds to the phase difference between the two signals. This phase difference voltage is supplied to low-pass filter 2. The phase difference voltage outputted from phase detector 1 is preferably first amplified by an amplifier (not shown) and then applied to low-pass filter 2. A device having the constitution of the above-described FIG. 2 is used as voltage-controlled oscillator 3. Low-pass filter 2 eliminates the high-frequency components from the phase difference voltage to smooth the voltage and generate control voltage $V_{cp}$. Switch 8 is provided between low-pass filter 2 and voltage-controlled oscillator 3, performs switching in accordance with selection signal S between control voltage (referred to as the "PLL control voltage") $V_{cp}$ from low-pass filter 2 and dc voltage (referred to as the "internal control voltage") $V_{co}$ from dc voltage source 9, and applies the selected voltage to variable-voltage capacitance element 6 of voltage-controlled oscillator 3 (see FIG. 2).

Selection signal S indicates a value of either "0" or "1" according to the presence or absence of reference signal $f_r$ that is received as input from phase detector 1. More specifically, detector (DET) 12 for detecting the presence or absence of reference signal $f_r$ is provided as shown by the broken line in FIG. 3, and selection signal S is outputted from this detector 12 such that "1" is outputted when reference signal $f_r$ is being received and "0" is outputted when reference signal $f_r$ is not being received. Switch 8 selects PLL-control voltage $V_{cp}$ when "1" is received as selection signal S and supplies this PLL-control voltage $V_{cp}$ to voltage-controlled oscillator 3. Alternatively, switch 8 selects internal control voltage $V_{co}$ when "0" is received as selection signal S and supplies this internal control voltage $V_{co}$ to voltage-controlled oscillator 3.

Figure 4:
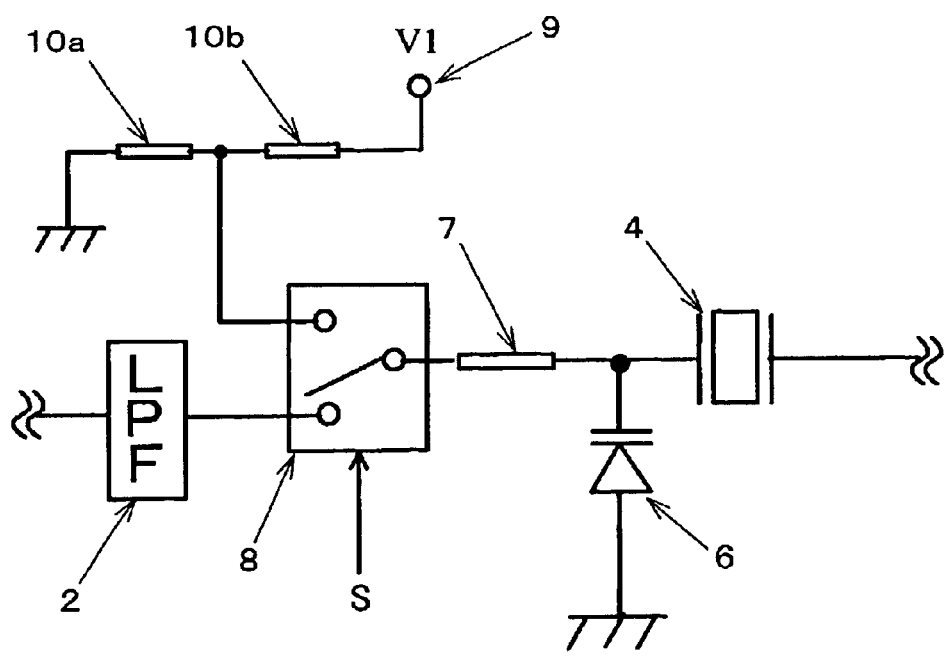
FIG. 4 is a view showing the actual configuration of a dc voltage source in the PLL-controlled oscillator shown in FIG. 3.

As shown, for example, in FIG. 4, dc voltage source 9 divides the voltage from stabilized voltage source V1 by means of resistors 10a and 10b and generates internal control voltage $V_{co}$. Internal control voltage $V_{co}$ is here a constant value, and more specifically, a voltage such that voltage-controlled oscillator 3 oscillates at the reference output frequency of PLL-controlled oscillator. The reference output frequency is the frequency at which PLL-controlled oscillator is to oscillate in cases such as when reference signal $f_r$ is interrupted.

With this configuration, when there is input of reference signal $f_r$ to phase detector 1 of the PLL-controlled oscillator, selection signal S having the value "1" causes voltage-controlled oscillator 3 to be supplied with PLL-control voltage $V_{cp}$ and operate normally to obtain output frequency $f_o$. On the other hand, when there is no input of reference signal $f_r$, selection signal S having the value "0" causes voltage-controlled oscillator 3 to be supplied with internal control voltage $V_{co}$, which is a fixed voltage, to obtain output frequency $f_o$.

When this PLL-controlled oscillator is applied as a jitter filter, PLL-control voltage $V_{cp}$ or internal control voltage $V_{co}$ is selected by means of selection signal S in accordance with the presence or lack of a clock signal as reference signal $f_r$, whereby output frequency $f_o$ can be obtained regardless of the presence or lack of the clock signal. In particular, when there is no input of reference signal $f_r$, selection signal S can cause the selection of internal control voltage $V_{co}$, and the need to provide a synchronizing signal generator can therefore be eliminated, a jitter filter can be realized with a simple construction and at a lower cost, and further, miniaturization can be promoted.

Figure 5:
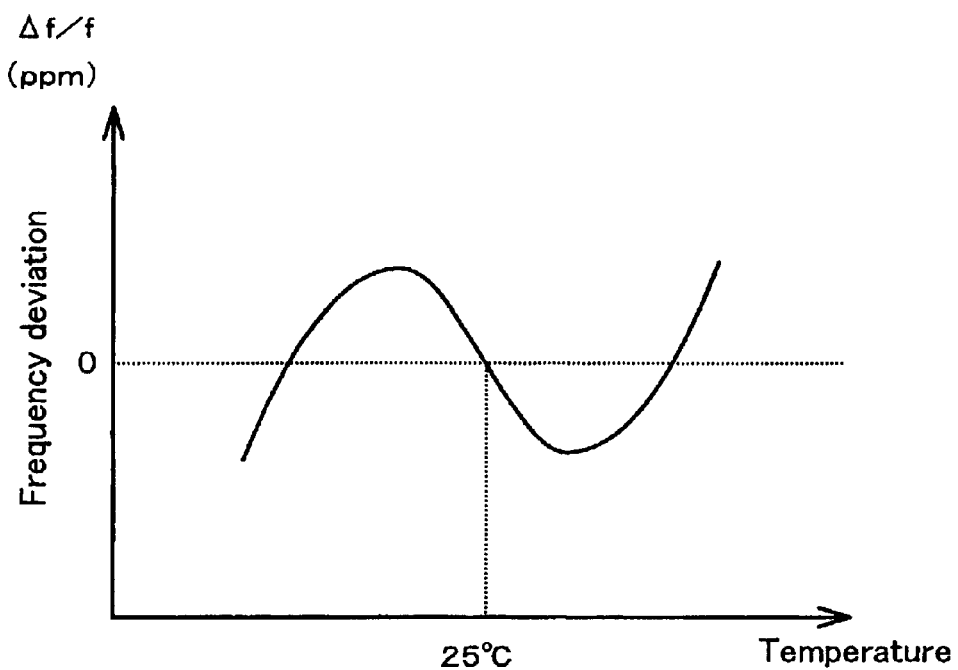
FIG. 5 is a graph showing the frequency-temperature characteristic of a voltage-controlled-crystal oscillator that is used in the PLL-controlled oscillator shown in FIG. 3.

Although internal control voltage $V_{co}$ from dc voltage source 9 was a fixed value in the PLL-controlled oscillator of the first embodiment described in the foregoing explanation, internal control voltage $V_{co}$ may be a voltage which compensate the frequency temperature characteristic of the crystal unit that depends on the ambient temperature. When reference voltage $f_r$ is interrupted in the circuit shown in FIG. 3, internal control voltage $V_{co}$, which is a stabilized voltage, is applied to variable-voltage capacitance element 6, whereby oscillation frequency (i.e., output frequency) $f_o$ of voltage-controlled oscillator 3 changes according to the frequency-temperature characteristic of crystal unit 4 provided in voltage-controlled oscillator 3. When a device having an AT-cut quartz crystal blank is used as crystal unit 4, the frequency-temperature characteristic of the device is represented by a cubic curve having an inflection point in the vicinity of normal temperature as shown in FIG. 5, and fluctuation in the output frequency $f_o$ that accompanies changes in the ambient temperature is also represented by this frequency-temperature characteristic. The frequency deviation Δf the vertical axis in the graph is represented as the difference between the central frequency f and the frequency at each temperature.

The use of temperature-compensated voltage, in which the frequency-temperature characteristic of the crystal oscillator is compensated, as internal control voltage $V_{co}$ that is applied from dc voltage source 9 to variable-voltage capacitance element 6 allows output frequency $f_o$ to be kept uniform and free of influence from changes in the ambient temperature even when the reference signal $f_r$ has been lost. In such cases, the temperature-compensated voltage used as internal control voltage $V_{co}$ is represented by a cubic curve in which the cubic curve that indicates the frequency-temperature characteristic of crystal unit 4 is canceled out.

Although selection signal S varied according to the presence or lack of reference signal $f_r$ in the foregoing explanation, selection signal S may also vary according to causes other than the presence or absence of reference signal $f_r$.

Figure 6:
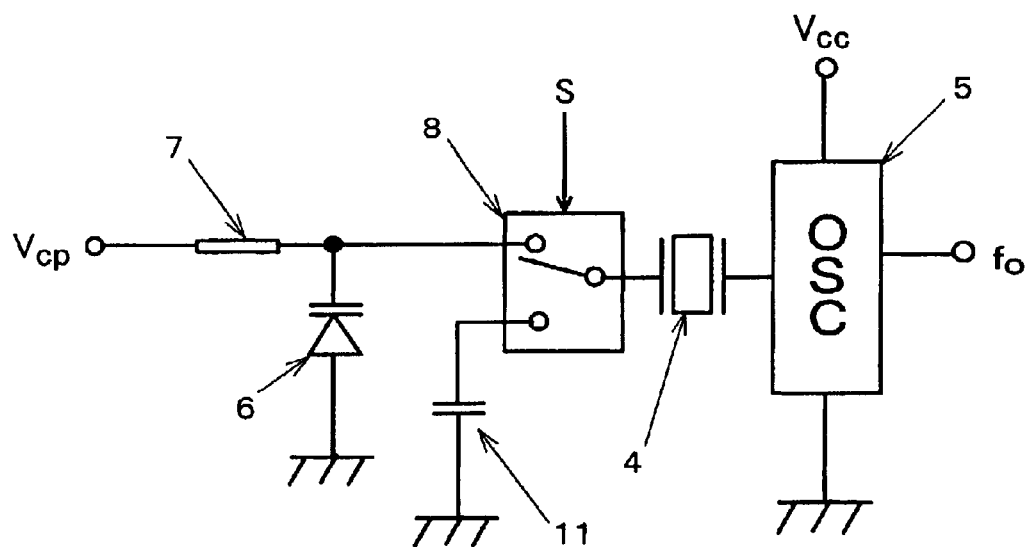
FIG. 6 is a block diagram showing the configuration of the principal portions of a PLL-controlled oscillator of a second embodiment of the present invention.

FIG. 6 shows a PLL-controlled oscillator of the second embodiment of the present invention. This PLL-controlled oscillator also employs an input-switching voltage-controlled oscillator that is based on the present invention. In addition, FIG. 6 shows the constitution of the portion of PLL-controlled oscillator that includes variable-voltage capacitance element 6 and voltage-controlled oscillator 3. Constituent elements in FIG. 6 that are identical to elements shown in FIG. 3 are identified by the same reference numerals, and redundant explanation is omitted.

As with the oscillator shown in FIG. 3, the PLL-controlled oscillator of the second embodiment is provided with phase detector 1, low-pass filter 2, voltage-controlled oscillator 3 and switch 8; and is further provided with capacitor 11 of fixed capacitance. Switch 8 is provided between crystal unit 4 of voltage-controlled oscillator 3 and variable-voltage capacitance element 6 in this PLL-controlled oscillator. One terminal of switch 8 is connected to variable-voltage capacitance element 6 to which PLL-control voltage $V_{cp}$ is applied from low-pass filter 2, and the other terminal of switch 8 is connected to one end of capacitor 11. The other end of capacitor 11 is grounded.

As with the oscillator of the first embodiment, selection signal S of "1" is supplied to switch 8 in this PLL-controlled oscillator when there is input of reference signal $f_r$ to the PLL-controlled oscillator, and a selection signal S of "0" is supplied when there is no input of reference signal $f_r$. Switch 8 connects variable-voltage capacitance element 6 to crystal unit 4 when selection signal S of "1" is received as input, and connects capacitor 11 to crystal unit 4 when selection signal S of "0" is received as input. As a result, this PLL-controlled oscillator operates similarly to the PLL-controlled oscillator in the first embodiment when there is input of reference signal $f_r$. When there is no input of reference signal $f_r$, the PLL-controlled oscillator oscillates at a frequency that corresponds to the capacitance of capacitor 11. The capacitance of capacitor 11 is therefore preferably set to a value such that oscillation circuit 5 oscillates at the reference output frequency of the PLL-controlled oscillator.

In this second embodiment, moreover, instead of using capacitor 11 of fixed capacitance, thermistors may be connected in parallel or connected in two series, whereby a temperature-compensation circuit is used for changing the serial equivalent capacitance in an oscillation closed loop or the capacitance between terminals with respect to the ambient temperature. The use of such a temperature-compensation circuit allows compensation of the frequency-temperature characteristic in the output frequency $f_o$.

What is claimed is:

1. An input-switching voltage-controlled oscillator, comprising:
    a phase-locked loop (PLL) provided with a variable-voltage capacitance element and a voltage-controlled oscillator;
    a source of voltage independent of the variable-voltage capacitance element; and
    a switch for selecting one of a plurality of voltages including the variable-voltage capacitance and the independent voltage source in accordance with a selection signal and applying said selected voltage as a control voltage to the voltage-controlled oscillator, wherein when the selection signal is supplied, the switch selects said variable voltage capacitance element as a normal operation mode to operate the voltage-controlled oscillator as a PLL-controlled oscillator.

2. The voltage-controlled oscillator according to claim 1, wherein a crystal unit is included in said oscillation closed loop and said voltage-controlled oscillator is constituted as a voltage-controlled crystal oscillator.

3. The voltage-controlled oscillator according to claim 2, wherein a first voltage of said plurality of voltages is a voltage that is obtained by applying a signal corresponding to a phase difference between a reference signal and an output signal of said voltage-controlled oscillator to a low-pass filter.

4. The voltage-controlled oscillator according to claim 3, wherein a second voltage of said plurality of voltages is a voltage that is separate from said first voltage and that is supplied from a dc voltage source.

5. The voltage-controlled oscillator according to claim 3, further comprising a detector for detecting presence or absence of said reference signal and outputting said selection signal, wherein said first voltage is selected when said reference signal is received as input.

6. The voltage-controlled oscillator according to claim 4, further comprising a detector for detecting presence or lack of said reference signal and outputting said selection signal, wherein said first voltage is selected when said reference signal is received as input, and said second voltage is selected when said reference signal is lacked.

7. The input-switching voltage-controlled oscillator according to claim 1, wherein the separate voltage source is selected from the group consisting of a constant voltage source, a capacitor, and a temperature-compensated voltage source.

8. The input-switching voltage-controlled oscillator according to claim 7, wherein when the constant voltage source or the condenser is selected, the voltage-controlled oscillator operates as a crystal oscillator, and when the temperature-compensated voltage source is selected, the voltage-controlled oscillator operates as a temperature-compensated oscillator (TCXO), wherein the voltage-controlled oscillator operates independently of the PLL.

9. An input-switching voltage-controlled oscillator comprising:
   a variable-voltage capacitance element to which a control signal is applied;
   a capacitor; and
   a switch for mutually exclusively selecting one of said variable-voltage capacitance element or said capacitor according to a selection signal and inserting the selected one into an oscillation closed loop.

10. The voltage-controlled oscillator according to claim 9, wherein said oscillation closed loop includes a crystal unit and said voltage-controlled oscillator is constituted as a voltage-controlled crystal oscillator.

11. An input-switching voltage-controlled oscillator comprising:
    a variable-voltage capacitance element to which a control signal is applied;
    a capacitor; and
    a switch for selecting one of said variable-voltage capacitance element and said capacitor according to a selection signal and inserting the selected one into an oscillation closed loop,
    wherein said oscillation closed loop includes a crystal unit, said voltage-controlled oscillator is constituted as a voltage-controlled crystal oscillator, and said control voltage is a voltage that is obtained by applying a signal corresponding to a phase difference between a reference signal and an output signal of said voltage-controlled oscillator to a low-pass filter.

12. The voltage-controlled oscillator according to claim 11, further comprising a detector for detecting presence or lack of said reference signal and outputting said selection signal, wherein said variable-voltage capacitance element is selected when said reference signal is received as input and said capacitor is selected when said reference signal is lacked.

13. A PLL-controlled oscillator comprising:
    a phase comparator for detecting phase difference between a reference signal and an output signal;
    a low-pass filter connected to an output of said phase comparator for outputting a control voltage;
    an oscillation means for generating said output signal;
    a capacitor; and
    a selection means for, in accordance with a selection signal, making a transition between a first state in which the oscillation means is caused to oscillate at an output frequency that changes in accordance with said control voltage and a second state in which said oscillation means is caused to oscillate at an output frequency that is regulated by the capacitor and is unaffected by said PLL-control signal, wherein the switch selects mutually exclusively one of the control voltage or the capacitor.

14. The PLL-controlled oscillator according to claim 13, wherein said oscillation means includes at least a variable-voltage capacitance element to which said control voltage is applied in said first state and a crystal unit.

15. The PLL-controlled oscillator according to claim 13, further comprising a detection means for detecting presence or lack of said reference signal and outputting said selection signal.

16. An input-switching voltage-controlled oscillator, comprising:
    a phase-locked loop (PLL) provided with a variable-voltage capacitance element and a voltage-controlled oscillator;
    another oscillation closed-loop independent of the PLL, using the voltage-controlled oscillator; and
    a switch for selecting one of the PLL or the other loop in accordance with a selection signal and applying the selected voltage as a control voltage to the voltage-controlled oscillator, wherein when the selection signal is supplied, the switch selects the PLL as a normal operation mode to operate the voltage-controlled oscillator as a PLL-controlled oscillator.

* * * * *